United States Patent [19]
Gambino et al.

[11] Patent Number: 6,004,837
[45] Date of Patent: Dec. 21, 1999

[54] DUAL-GATE SOI TRANSISTOR

[75] Inventors: Jeffrey P. Gambino, Gaylordsville, Conn.; Jack A. Mandelman, Stormville, N.Y.

[73] Assignee: International Business Machines Corporation, Armonk, N.Y.

[21] Appl. No.: 09/025,673

[22] Filed: Feb. 18, 1998

[51] Int. Cl.[6] .................................................. H01L 21/00
[52] U.S. Cl. ............................................ 438/157; 438/159
[58] Field of Search ................................. 438/157, 159, 438/163

[56] References Cited

U.S. PATENT DOCUMENTS

| | | |
|---|---|---|
| 5,120,666 | 6/1992 | Gotou ........................................ 437/40 |
| 5,461,250 | 10/1995 | Burghartz et al. ...................... 257/347 |
| 5,578,513 | 11/1996 | Maegawa .................................. 437/40 |
| 5,646,058 | 7/1997 | Taur et al. ................................. 437/40 |
| 5,926,699 | 7/1999 | Hayahsi et al. .......................... 438/151 |
| 5,933,736 | 8/1999 | Nakaumura ............................. 438/283 |

*Primary Examiner*—John F. Niebling
*Assistant Examiner*—Michael S. Lebentritt

[57] ABSTRACT

A dual-gate SOI transistor has self-aligned upper and lower gates, in which a gate trench that will hold the dual-gate structure is formed by damaging the oxide under the transistor active area and preferentially etching that damaged region with HF, thus producing a self-aligned opening that has less overlap of the lower gate and the source/drain junctions and is filled with LPCVD polysilicon to form a dual-gate structure having reduced capacitance compared with prior art devices.

7 Claims, 3 Drawing Sheets

DUAL-GATE SOI TRANSISTOR

TECHNICAL FIELD

The field of the invention is the fabrication of Silicon on Insulator (SOI) field effect transistor (FET) integrated circuits.

SUMMARY OF THE INVENTION

The invention relates to a dual-gate SOI transistor having self-aligned upper and lower gates, in which a gate trench that will hold the dual-gate structure is formed by damaging the oxide under the transistor active area and preferentially etching that damaged region with HF, thus producing a self-aligned opening that is filled with polysilicon to form a dual-gate structure having reduced capacitance compared with prior art devices.

BACKGROUND OF THE INVENTION

U.S. Pat. No. 5,497,019 shows a dual-gate transistor in which the lower gate is formed by flip-bonding a second wafer to the wafer containing the main portion of the transistor.

Yang, et al (J. Vac. Sci. Tech., vol. B14, 4204 (1996) show a dual-gate SOI FET in which selective doping of an insulating polysilicon bottom gate results in the drawback of lateral diffusion of the dopant.

Colinge, et al show a dual-gate transistor with a cavity under the gate that is not self-aligned and therefore will result in greater capacitance.

DESCRIPTION OF THE PREFERRED EMBODIMENTS

The advantages of dual gate SOI structures in providing greater drive and permitting the use of thicker fully depleted transistors are well known. Also well known are various problems such as excessive capacitance caused by lateral dopant diffusion in the case of implanted lower gates and misalignment in the case of bonded structures in which the main transistor is formed in one wafer and the lower gate is formed in another wafer that is bonded to the first wafer.

Figure 1:
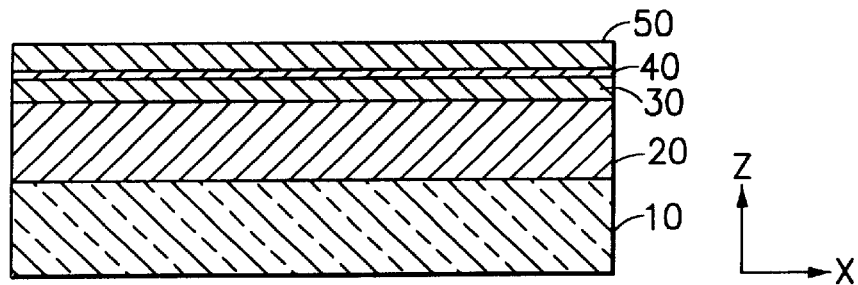
FIG. 1, there is shown a portion of a SOI Wafer that will contain a transistor according to the invention.

Referring now to FIG. 1, there is shown a portion of a SOI wafer that will contain a transistor according to the invention, in which bulk substrate 10 (SOI substrate) has a backside insulating layer 20 disposed on it. The preferred backside insulating material is oxide, $SiO_2$. Insulating SOI layer 20 may have a thickness range of 100 nm–500 nm, (though other materials such as silicon nitride may be used) with a preferred value of 300 nm. Silicon transistor layer 30, having a nominal thickness of 100 nm (a range of 50 nm–200 nm is appropriate) will contain the transistor channel, source and drain. A 20 nm thermal oxide layer 40 has been grown on layer 30 to facilitate removal of the first insulating layer, illustratively nitride ($Si_3N_4$). For convenience in description, the left-right direction in FIG. 1 will be referred to as the x-axis and the vertical direction as the z-axis. The dimension perpendicular to the plane of the paper will be referred to as the y-axis.

Figure 2:
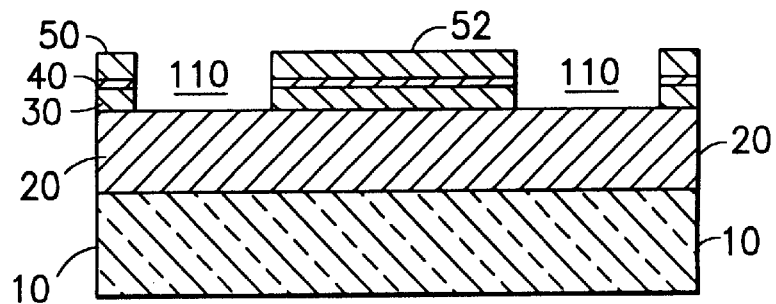
FIG. 2, shows the results of a reactive ion etching step.

FIG. 2 shows the results of a reactive ion etching step (RIE), in which trench 110 has been cut through layers 50, 40 and 30 to define the transistor region 52 in the center of the figure that will be the site of transistor. Conventionally, fluorine-based chemistry is used to cut through nitride 50 and oxide 40. Chlorine-based chemistry is then used to cut through silicon 30, stopping on oxide 20. On the right and left of the figure, portions of the nitride—oxide—silicon layers remain, illustrating that the nitride top surface can be used as a polish stop for chemical mechanical polish (CMP) operations.

Figure 3A:
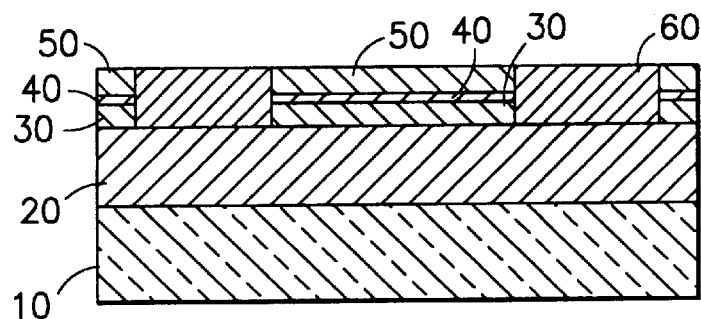
FIGS. 3A and 3B show the results of a conventional step of depositing.
Figure 3B:
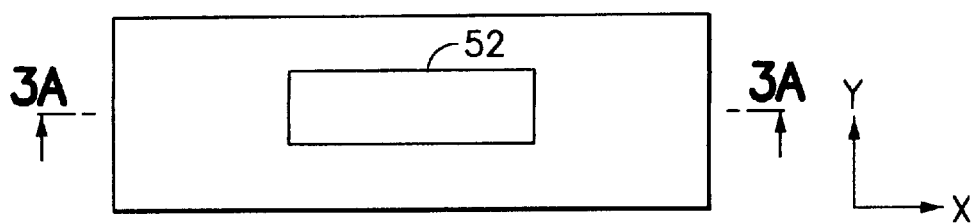

FIGS. 3A and 3B show the results of a conventional step of depositing (low pressure chemical vapor deposition—LPCVD) an oxide layer 60 and polishing it level with the top of nitride layer 50. FIG. 3B shows a top view of the area illustrating that the transistor region 52 is surrounded by the oxide fill of trench 110.

Figure 4A:
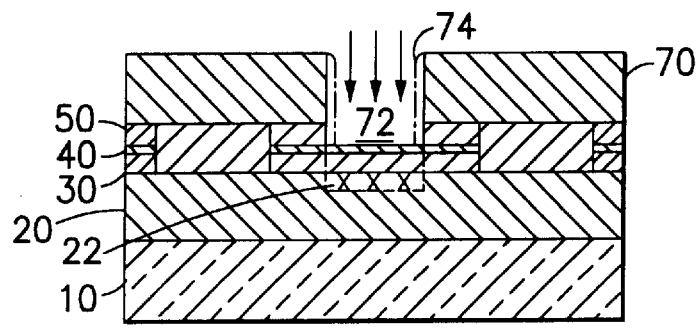
FIG. 4A shows a further manufacturing step.

FIG. 4A shows the results of a step in which a layer of photoresist 70 has been put down and patterned to form a gate trench and to expose what will become the active area of the transistor plus a portion of oxide 60 adjacent to the active area that will be removed to provide access for the formation of the bottom gate. An etching step, illustratively an oxide etch using conventional fluorocarbon chemistry with a C:F ratio $\geq 0.25$ first removes oxide 60 and an access depth of oxide 20 in the portion of region 82 outside region 84, after which a nitride etch using fluorocarbon chemistry with a C:F ratio of $\leq 0.5$ removes that portion of nitride layer 50 in region 84. The reason why this order is preferred is that oxide layer 40 will protect silicon layer 30 in the active region during the etching step.

Figure 4B:
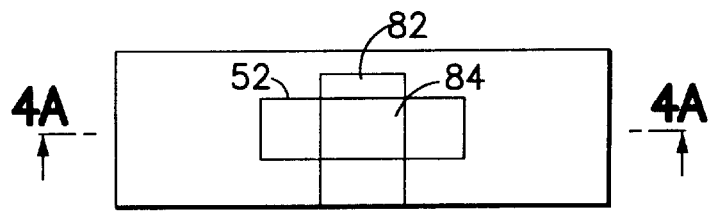
FIG. 4B shows a top view of the transistor gate region.

FIG. 4B, a top view, shows active area (transistor gate region) 84, which is the union of area 52 and area 82, and the total exposed trench 82. Referring back to FIG. 4A, there is shown an area 22 below the surface of oxide 20 that has been damaged by implantation of ions through the gate trench 72. The damaged area extends along the y-axis before and behind the plane of the paper, as can be seen in FIG. 4B. The ions have enough energy to penetrate silicon transistor layer 30 in the transistor gate region, i.e. the peak in the ion depth distribution is about 50 nm below layer 30 (a range of 0–200 nm is suitable) and to penetrate about 100 nm below the bottom surface of layer 30. Outside the gate transistor region, the penetration will be deeper, of course, because the ions are not retarded by interaction with layer 30. The penetration depth in this outside region is not significant. Preferably, the ions are from an element in the fourth column of the periodic table, illustratively silicon, so that the tail of the depth distribution will not have any effect on the doping of layer 30. Inert ions, such as Ar, Kr or Xe can also be used. The magnitude of the implant dose, referred to as a "damage dose" is illustratively greater than $1 \times 10^{13}/cm^2$ for heavy ions such as xenon or $1 \times 10^{14}/cm^2$ for light ions such as carbon. to produce a distinct difference in the etch rate of the self-aligned damaged gate region 22 of oxide 20 below region 82 and the undamaged portions adjacent to the damaged gate region 22. Assuming a thickness of layer 30 of 100 nm, typical implant conditions are a range of $5 \times 10^{13}/cm^2$ to $1 \times 10^{16}/cm^2$ for the dose magnitude and 80 keV–160 kev for the implant energy, with preferred values of $5 \times 10^{14}$/cm$^2$ and 120 keV.

Figure 5A:
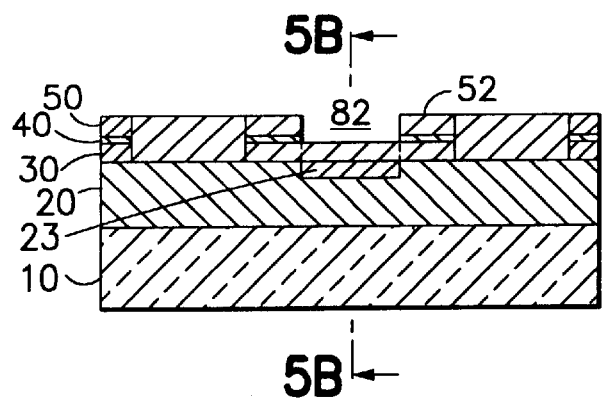
FIGS. 5A and 5B show results of further manufacturing.
Figure 5B:
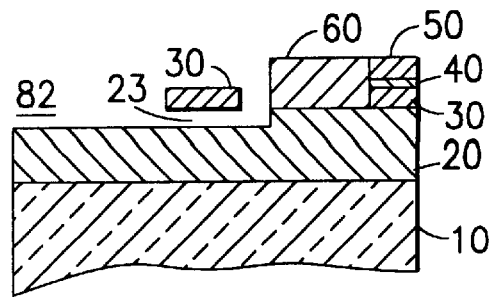

With resist 70 still in place, the gate trench is etched with a conventional isotropic etch of dilute HF or buffered HF. An isotropic dry etch such as HF vapor could also be used. The results are shown in FIGS. 5A and 5B. The thin oxide layer 40 has been stripped in region 84 and an opening 23 has been formed underneath region 84 in layer 20 by etchant penetrating from the side. FIG. 5B shows a cross section on the y-z plane through the etched region. A "bridge" of layer 30 remains above lower gate cavity 23 that will receive the polysilicon (poly) layer in the next step. An unetched portion of oxide 60 that was protected by resist 70 is shown on the right side of layer 82. A portion of nitride layer 52 that served as a CMP polish stop also remains on the right edge of this figure. On the left of the figure, aperture 82 extends to the edge of the visible region, as can be seen in top view 4B, showing that area 82 extends to the edge. Etch rate ratios of 5:1 between damaged and undamaged oxide have been demonstrated for the magnitude of damage achieved with this process. Accordingly, for an oxide layer under a 0.2 μm wide channel in the y direction, a 150 nm lateral oxide etch under the active region 84 (100 nm from each side with a 50% overetch) would produce a 30 nm overlap of the lower gate and the source and drain junctions along the x-direction. Those skilled in the art will appreciate that routine optimization of the implant and wet etch parameters can be expected to improve this value. Resist 70 is stripped after this wet etch step.

Optionally, the overlap between the bottom gate and the source/drain junctions can be reduced by forming polymer (e.g. polyimide) or oxide spacers 74 on the sides of the gate trench prior to the damage implantation step. Spacers 74 are shown as dotted lines in FIG. 4A. Sidewalls can be formed with the resist in place if a deposition temperature of less than 150° C. is used (e.g. sputter deposition of oxide). If higher temperatures are used, then resist 70 should be stripped before the sidewall formation step.

The sidewall thickness should be comparable to the lateral etch distance of region 22 (about 30 nm). Such spacers are removed after the HF etch of region 22.

Figure 6A:
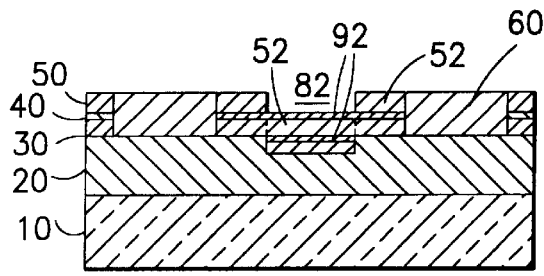
FIGS. 6A and 6B show a thermal oxidation step.
Figure 6B:
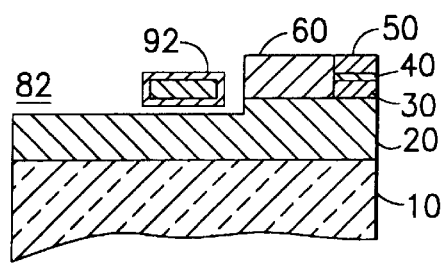

A 5 nm (3 nm–20 nm) gate oxide 92 is thermally grown on the top, bottom and sidewalls of the exposed portions of SOI layer 20, as shown in FIGS. 6A and 6B. If desired, an anneal (800° C.–1100° C.) can be performed before the gate oxidation step to remove implant damage in the active region.

Figure 7A:
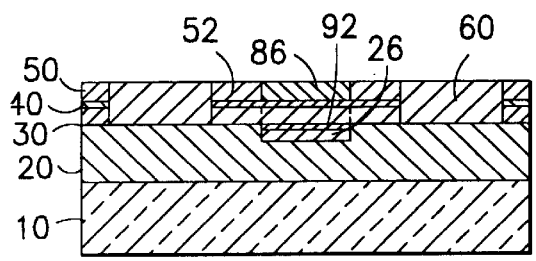
FIGS. 7A and 7B show a chemical vapor deposition step.
Figure 7B:
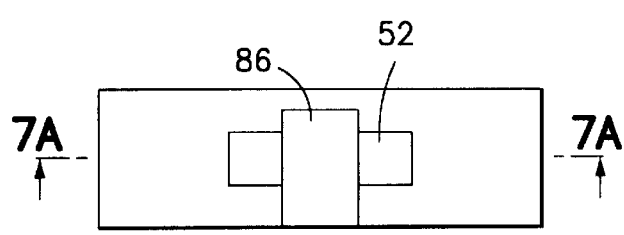

Referring now to FIGS. 7A and 7B, conformal poly layer 86 has been deposited by LPCVD to fill gate trench 82, with the excess removed by CMP. It is not essential that region 22 be completely filled, since the poly adheres to the bottom surface of gate oxide 92 to form a thin gate before any portion of the gas flow is blocked. Small gaps or voids that may be formed in the lower portions of region 22 are of no effect for transistor operation. For a single work function gate, the poly can be doped as it is deposited (with phosphorous, for example). For dual work function gates, intrinsic poly is deposited and then doped by ion implantation. This can be done either before or during the source/drain implants. The earlier implant has the advantage that a separate gate activation anneal can be used to ensure that the dopant reaches the bottom gate, rather than having to rely on the source/drain anneal for activation of dopants in the gates. Typical parameters are a temperature range of 800° C.–1,000° C. and corresponding times of 1hour–10seconds.

Figure 8A:
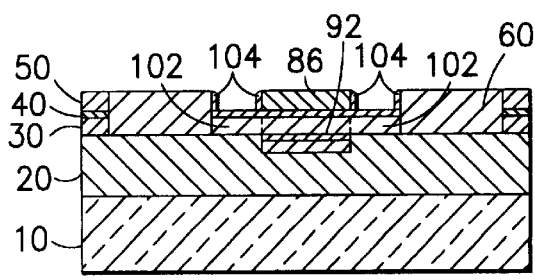
FIGS. 8A and 8B show cross section views of completed transistor.
Figure 8B:
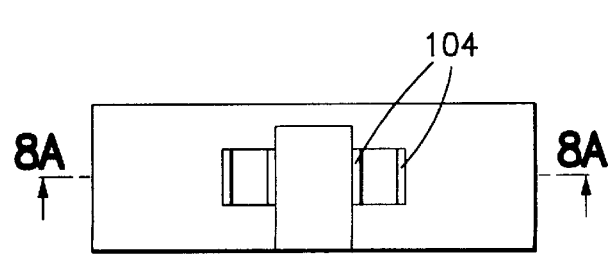

The remainder of layer 52 is removed with a wet or dry etch that is selective to both Si and SiO$_2$, e.g. H$_3$PO$_4$. A 50 nm (20 nm–100 nm) nitride layer is redeposited by LPCVD, then etched by RIE to form spacers for the source/drain implant. A conventional source/drain implant and anneal completes the transistor results are shown in FIGS. 8A and 8B. Conventional back end steps complete the formation of the circuit in question.

The structure that results from this process has a transistor body extending along the x-axis, including a source, a drain and a channel disposed between them in the silicon transistor layer 30, with gate oxide on four surfaces of the transistor gate region (active region)—top and bottom, parallel to the x-y plane and two sides parallel to the x-z plane. A continuous polysilicon gate extends around the active region, in contact with the gate oxide on the four surfaces.

While the invention has been described in terms of a single preferred embodiment, those skilled in the art will recognize that the invention can be practiced in various versions within the spirit and scope of the following claims.

We claim:

1. A method of making a dual-gate SOI transistor comprising the steps of:

forming a first insulating layer of a first insulating material on an SOI substrate, said SOI substrate comprising a backside insulating layer and a silicon transistor layer disposed above said backside insulating layer;

patterning said first insulating layer to form a transistor region of said first insulating layer, said transistor region having a transistor width along an x-axis and a transistor length along a y-axis;

etching a gate trench through said first insulating layer and into said backside insulating layer in a gate trench region overlapping said transistor region and extending a gate width less than said transistor width along said x-axis and a gate length greater than said transistor length along said y-axis, whereby said gate trench region overlaps said transistor region in a transistor gate region and extends outside said transistor region;

implanting a damage dose of ions into a lower gate region of said backside insulating layer disposed below said gate trench, whereby said backside insulating layer in said gate trench is damaged by mechanical collisions of said damage dose of ions;

etching said background insulating layer to form a self-aligned gate cavity with an etchant that attacks damaged backside insulating material at a higher rate than undamaged background insulating material, whereby said etchant removes background insulating material located underneath said transistor gate region of said silicon transistor layer to form said self-aligned gate cavity;

depositing a conformal layer of conductive material in said gate trench, thereby forming dual gate electrodes, an upper gate electrode above said transistor gate region of said silicon transistor layer and a lower gate electrode in said gate cavity below said silicon transistor layer; and forming a source and drain in said silicon transistor layer.

2. A method according to claim 1, in which:

said step of patterning said first insulating layer includes the step of removing that portion of said first insulating layer outside said transistor region and within said gate trench region;

depositing a layer of a second insulating material and polishing said second insulating material coplanar with a top surface of said first insulating material;

said step of etching said gate trench comprises etching said first insulating material above said transistor gate region; and etching said second insulating material outside said transistor gate region to a depth below a bottom surface of said silicon transistor layer.

3. A method according to claim 2, said step of etching said gate trench comprises the steps of:

etching said second insulating material outside said transistor gate region to a depth below a bottom surface of said silicon transistor layer with a first etchant that selectively etches said second insulating material in preference to said first insulating material, whereby said first insulating material protects said silicon transistor layer; and thereafter etching said first insulating material above said transistor gate region with a second etchant.

4. A method according to claim 3, in which:

a layer of photoresist is deposited and patterned to defined said gate trench, having a gate trench distance along said x-axis, before said step of etching;

with said layer of photoresist in place, sidewalls are formed substantially parallel to said y-axis to a sidewall thickness substantially equal to a lateral etch thickness approximately equal to a lateral etch distance etched into undamaged backside insulating material by said etchant, whereby a lateral damage length along said x-axis of that portion of said background insulating layer damaged by said damage dose of ions is reduced by twice said sidewall thickness and said cavity length of said gate cavity along said x-axis is substantially equal to said lateral damage length plus twice said sidewall thickness.

5. A method according to claim 3, in which:

a layer of photoresist is deposited and patterned to defined said gate trench, having a gate trench distance along said x-axis, before said step of etching;

after said layer of photoresist has been removed, sidewalls are formed substantially parallel to said y-axis to a sidewall thickness substantially equal to a lateral etch thickness approximately equal to a lateral etch distance etched into undamaged backside insulating material by said etchant, whereby a lateral damage length along said x-axis of that portion of said background insulating layer damaged by said damage dose of ions is reduced by twice said sidewall thickness and said cavity length of said gate cavity along said x-axis is substantially equal to said lateral damage length plus twice said sidewall thickness.

6. A method according to claim 3, in which:

a layer of thermal oxide is grown on exposed surfaces of said silicon transistor layer after said step of etching and before said step of depositing polysilicon.

7. A method according to claim 6, in which:

an annealing step is performed after said step of etching to activate ions in said conformal layer of conductive material.

* * * * *